United States Patent [19]
Popovic et al.

[11] Patent Number: 4,673,964
[45] Date of Patent: Jun. 16, 1987

[54] BURIED HALL ELEMENT

[75] Inventors: Radivoje Popovic; Katalin Solt, both of Zug; Jean-Luc Berchier, Menzingen, all of Switzerland

[73] Assignees: LGZ Landis; Gyr Zug AG, both of Zug, Switzerland

[21] Appl. No.: 810,929

[22] Filed: Dec. 18, 1985

[30] Foreign Application Priority Data

May 22, 1985 [CH] Switzerland ............................ 176/85

[51] Int. Cl.$^4$ ............................................ H01L 27/22
[52] U.S. Cl. ........................................ 357/27; 357/55; 357/47
[58] Field of Search ............... 357/27, 47, 48, 55; 307/309; 330/6

[56] References Cited

U.S. PATENT DOCUMENTS

| | | | |
|---|---|---|---|
| 3,372,070 | 3/1968 | Zuk | 357/48 X |
| 3,668,439 | 6/1972 | Fujikawa et al. | 357/27 X |
| 3,852,802 | 12/1974 | Wolf et al. | 357/27 |
| 4,129,880 | 12/1978 | Vinal | 357/27 |
| 4,141,026 | 2/1979 | Bate et al. | 357/27 |
| 4,253,107 | 2/1981 | MacDougall | 357/27 |

FOREIGN PATENT DOCUMENTS 52-57792  5/1977  Japan ................................. 357/55

OTHER PUBLICATIONS

"The Vertical Hall-Effect Device" by R. S. Popovic, in *IEEE Electron Device Letters*, vol. EDL-5, No. 9, Sep. 1984, pp. 357–358.

"Hall Effect Probes and Their Use in a Fully Automated Magnetic Measuring System" by M. W. Poole and R. P. Walker, in *IEEE Transactions on Magnetics*, vol. MAG-17, No. 5, Sep. 1981, pp. 2129–2132.

*Primary Examiner*—Martin H. Edlow
*Assistant Examiner*—Sara W. Crane
*Attorney, Agent, or Firm*—Marmorek, Guttman & Rubenstein

[57] ABSTRACT

A Hall element incorporated inside a semiconductor body has a P-N junction barrier which surrounds the active zone of the Hall element in all directions. The output of the Hall element is connected through a feedback control circuit to control the thickness of the P-N junction barrier, thereby ensuring long duration, temperture stability and linearity for the Hall element.

19 Claims, 21 Drawing Figures

BURIED HALL ELEMENT

BACKGROUND OF THE INVENTION

This invention relates to a Hall element that can be incorporated into an integrated circuit.

Devices of this type are, for example, used in wattmeters to measure an electric current $i_N$ or to form a voltage/current product $u_N \cdot i_N$, where $u_N$ designates the supply voltage of an electric supply system and $i_N$ the electric current used by a consumer of electric energy. Since the current $i_N$ is proportional to the magnetic field $H_N$ it produces, the Hall element indirectly measures the current $i_N$ by determining the magnetic field $H_N$. Since the output voltage $V_H$ of the Hall element is proportional to the product of $i \cdot H_N$, where i represents the supply current of the Hall element, the Hall element will also form the voltage/current product $u_N \cdot i_N$, if the supply current i of the Hall element, for instance with the aid of a resistance, is selected in proportion to the supply voltage $u_N$. In this case the Hall element has to work as a four-quadrant multiplier, as $u_N$ and $i_N$, and also i and $H_N$, are sine-shaped, thus having positive and negative values.

An integrated vertical Hall element is known from the publication "The vertical Hall-effect device", R. S. Popovic, IEEE Electron Device Letters, Vol. EDL-5, No. 9, September 84, pages 357–358. Vertical Hall elements are Hall elements which measure magnetic fields $H_N$ which are oriented parallel t the surface of the Hall element.

As concerns the stability, and especially the long-time stability of Hall elements, only some principles are known, as can, for example, be seen from the publication "Hall Effect Probes And Their Us In A Fully Automated Magnetic Measuring System", M. W. Poole and R. P. Walker, IEEE Transactions on Magnetics, Vol. MAG-17, No. 5, September 81, page 2132.

SUMMARY OF THE INVENTION

The object of this invention is to provide integrated circuit Hall elements which are stable for long times. It is a further object to use a technology which allows the manufacture of both Hall elements and transistors in the same integrated circuit.

Other objects of this invention are to make the integrated Hall elements temperature-stable and to linearize their characteristic curve $V_H=f(B)$ at a given constant supply current i, where $V_H$ designates the output voltage of the Hall element and $B=\mu H_N$ the induction of the magnetic field $H_N$ to be measured.

The Hall element of the present invention comprises an active zone which is surrounded in all directions by a p-n junction barrier. The p-n junction barrier serves to protect the active zone from external influences, A feedback control circuit is used to control the thickness of the p-n junction barrier, thereby insuring temperature stability and linearity for the Hall element.

DESCRIPTION OF THE DRAWING

Some embodiments of the invention have been illustrated in the accompanying drawing, in which.

The same reference numerals serve to designate the same parts in all the figures.

DESCRIPTION OF THE PREFERRED EMBODIMENTS

Figure 1:
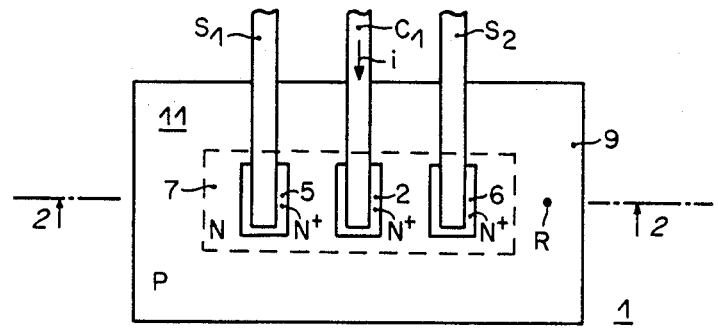
FIG. 1 shows a plan view of a first principal variant of a bured stable Hall element.

The Hall elements 1 or barrier-layer-field-effect transistors represented in FIGS. 1 to 16 are formed from silicon or from gallium arsenide (GaAs) material. The devices of the present invention comprise regions of P-type and regions of N- type material. The designations N+ and P+ indicate that the corresponding N or P material is strongly doped with impurity atoms, i.e. they have a dopant concentration of at least approximately $10^{20}$ ions per $cm^3$. Conversely, the designations N− and P− indicate that the corresponding N or P material is weakly doped with impurity atoms.

The active zones of the Hall elements or of the barrier-layer-field-effect transistors represented in FIGS. 1 to 16 may be either manufactured from a P−type or from an N−type material, which has no bearing on their function if the polarities of the pertinent supply voltages or supply currents are selected correspondingly correct. For simplification purposes, it is assumed in the drawings that the active zones are produced from an N⁻ material, which in no wa signifies a restriction of the subject matter of the present invention.

In FIGS. 1 to 16, for simplification purposes, the electric connections $C_1$, $C_2$, $C'_2$, $C''_2$, $S_1$, $S_2$, R and SUB of the Hall element 1 or the electric connections S, D, and G of the barrier-layer-field-effect transistors S, D and G are represented as wires. In practice, they will have, of course, the form of metallizations which are affixed as thin conducting paths onto the surface of the integrated Hall element 1 or field-effect transistor.

Figure 17:
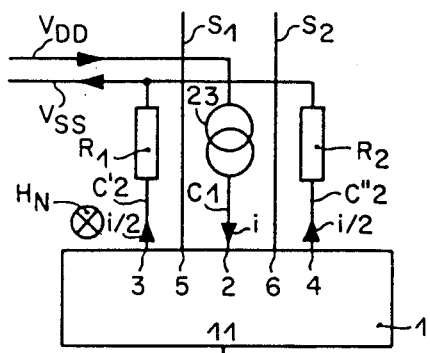
FIG. 17 shows a circuit of a vertical Hall element with five connections.
Figure 18:
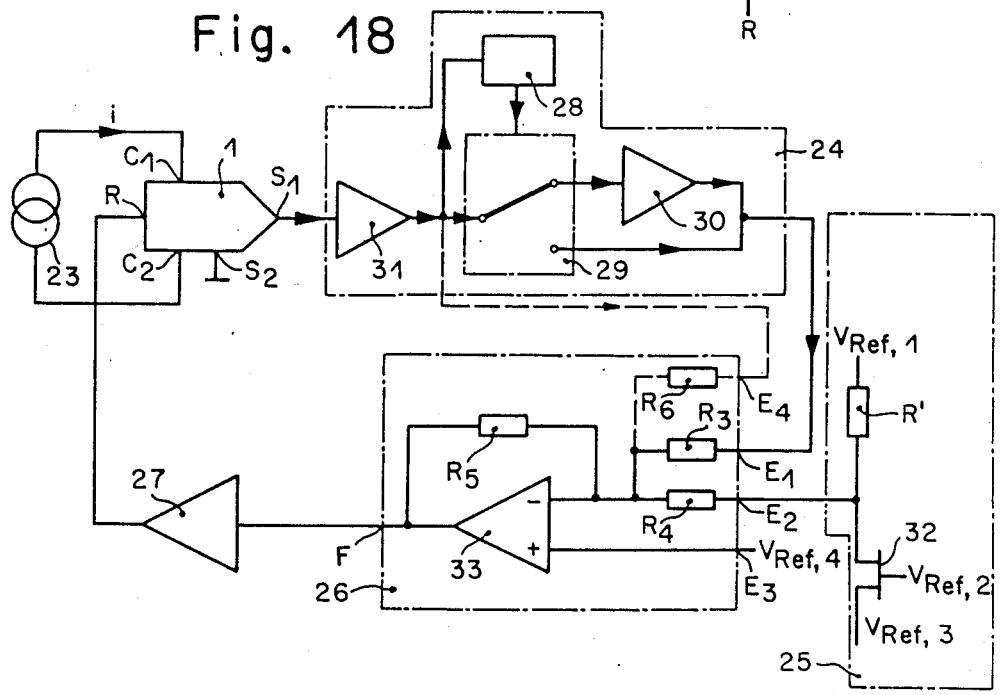
FIG. 18 shows a block diagram of an apparatus with a Hall element.

All of the Hall elements represented in FIGS. 1 to 5 have two current connections $C_1$ and $C_2$ and two sensor connections $S_1$ and $S_2$. All Hall elements 1 represented in FIGS. 8 to 11 and 14 to 16 have three current connections $C_1$, $C'_2$ and $C''_2$ and two sensor connections $S_1$ and $S_2$. In this case the Hall element 1 with the five electric connections $C_1$, $C'_2$, $C''_2$, $S_1$ and $S_2$ is always to be switched externally, as shown in FIG. 17. FIG. 18, for simplification purposes, shows a Hall element 1 with four current or sensor connections $C_1$, $C_2$, $S_1$ and $S_2$, which, however, does not imply a restriction to the four-connection variant. In the same way, the devices presented in FIGS. 1 to 5 are not restricted to the four-connection variants, and the devices presented in FIGS. 8 to 11 and 14 to 16 are not restricted to the five-connection variants; on the contrary, all combinations are possible.

Thus, in all variants, for example, one of the two sensor connections $S_1$ or $S_2$ is grounded while the other sensor connection $S_2$ or $S_1$ constitutes the output of Hall element 1. In the drawings, it was assumed that the first sensor connection $S_1$ forms the output of Hall element 1 and that the second sensor connection $S_2$ is grounded.

The electric connections $C_1$, $C_2$ or $C'_2$, $C''_2$, $S_1$ and $S_2$ of the Hall element each have a connection contact 2, 3, 4, 5 or 6, which contacts are illustratively well shaped regions of N⁺-material.

In FIGS. 1 to 4, two sensor connection contacts 5 and 6, as well as one of the current-connection contacts, for instance the first current-connection contact 2 that belongs to the first current connection $C_1$, are located on the top surface on the Hall element. The other, second current-connection contact 3 belonging to the second current-connection $C_2$ is located on the bottom surface, diametrically opposite the first current-connection contact 2, of the Hall element 1. The connection contacts 2, 5 and 6 arranged on the surface may, for example, all have the same size and further have the same rectangular well shape with rounded corners. The connection contacts 2, 5 and 6 are all arranged in an approximately straight line next-to-each other, wherein the first current-connection contact 2 lies in the middle and the two sensor-connection contacts 5 and 6 are arranged symmetrically about the first current-connection contact 2 in an approximately straight line. The active zone 7 of Hall element 1 lies beneath the top surface of the Hall element 1 on which the three connection contacts 2, 5 and 6 are arranged.

In FIGS. 8 to 11 and 14 to 16 all five connection contacts 2, 3, 4, 5 and 6 are arranged on the surface of Hall element 1. Here the connection contacts 2 to 6 may be of the same size and may, for instance, be rectangular wells with rounded corners. They are all arranged on an approximately straight line next-to-each other, wherein the first current-connection contact 2 lies in the middle and the two sensor-connection contacts 5 and 6 are arranged on either side of the current connection contact 2. The current connection contact 3 is located next to the sensor connection contact 5 and the current connection contact 4 is located next to the sensor connection contact 6. Thus, each sensor connection contact 5 or 6 lies between the first current-connection contact 2 and one of the two other current-connection contacts 3 or 4. Beneath the surface of Hall element 1 on which the five connection contacts 2 to 6 are arranged, there lies the active zone 7 of the Hall element. @Summarizing, the Hall element 1 has two sensor-connection contacts 5 and 6, and at least two current connection contacts 2 and 3. Three of the four connection contacts or all four connection contacts are arranged on the surface of the Hall element. All of the connection contacts 2 to 6 and the active zone 7 of Hall element 1 comprise material of the same conductivity type. All connection contacts 2 to 6 are strongly doped with impurity atoms. Since it was assumed that the Hall element 1 was constructed starting from an N material, all of the current and sensor connection contacts 2, 3, 5, 6 comprise N⁺ material while the active zone 7 of Hall element 1 is formed of an N⁻ or N material.

The active zone 7 of Hall element 1 is surrounded laterally by a ring 8, which has a ring connection R. Ring 8 need not be absolutely circularly shaped; as a rule, it is rectangular. The ring 8 widens into a top covering zone 9 and a bottom zone 10 in such a way that the ring 8, top zone 9, and bottom zone 10 wholly surround the active zone 7 of Hall element 1 on all sides. The sensor and current connection contacts 2 to 6 of Hall element 1 cross the top covering zone 9 or the bottom zon 10 to make electric contact with the active zone of Hall element 1. Ring 8, top covering zone 9, and the bottom zon 10 are always of the same conductivity type, in this case p-type. In all cases, ring 8, the top covering zone 9 and the bottom zone 10 are in electrical contact with each other, and they are all from a material of a conductivity type that is opposite to that of the active zone 7 and that of the sensor and current connection contacts 2 to 6 of Hall element 1. In our example, they thus comprise a P material.

Figure 2:
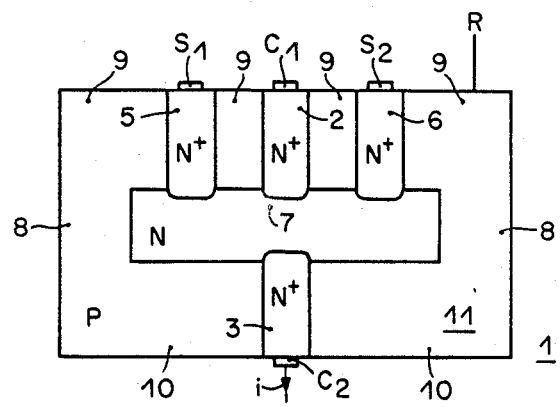
FIG. 2 shows a vertical cross-section through the Hall element represented in FIG. 1.
Figure 8:
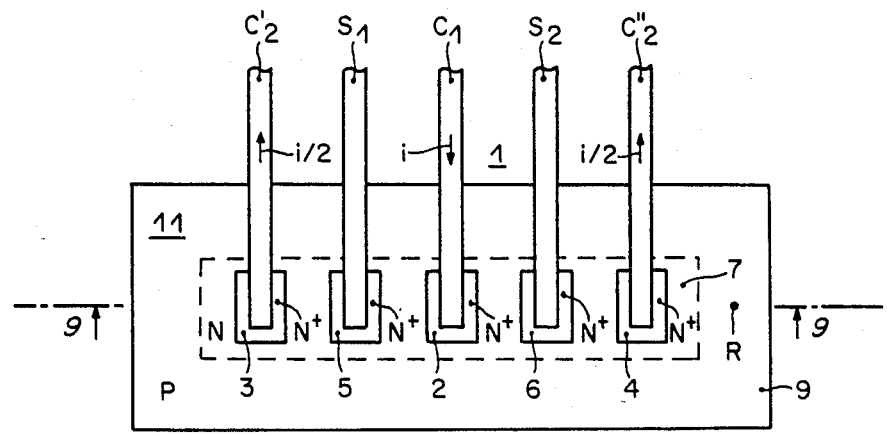
FIG. 8 shows a plan view of a second principal variant of a buried stable Hall element.
Figure 9:
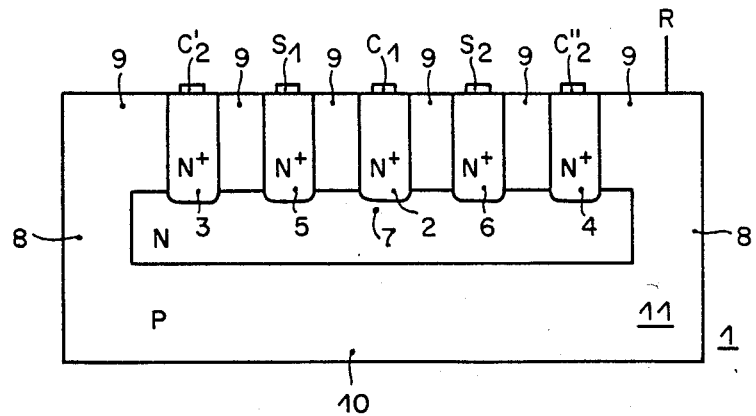
FIG. 9 shows a vertical cross-section through the Hall element represented in FIG. 8.

FIGS. 1 and 2 show plan view and a vertical cross-section of a first, principal variant of a stable Hall element 1. Similarly, FIGS. 8 and 9 show a plan view and a vertical cross-section of a second, principal variant of a stable Hall element 1. Both variants only differ by the number, four or five, of the current and sensor connections $C_1$, $C_2$, $S_1$ and $S_2$ or $C_1$, $C'_2$, $C''_2$, $S_1$ and $S_2$ with their respective connecting contacts 2, 3, 5 and 6 or 2, 3, 4, 5, 6. With the exception of the current and sensor connection contacts 2, 3, 5 and 6 or 2, 3, 4, 5, 6, the ring 8, the top covering zone 9, and the bottom zone 10 surround the active zone 7 of the Hall element completely in all directions, i.e. laterally, on top, and on the bottom. In both variants, the ring 8, top covering zone 9, and bottom zone 10, are formed as a single integrated region 11.

Figure 3:
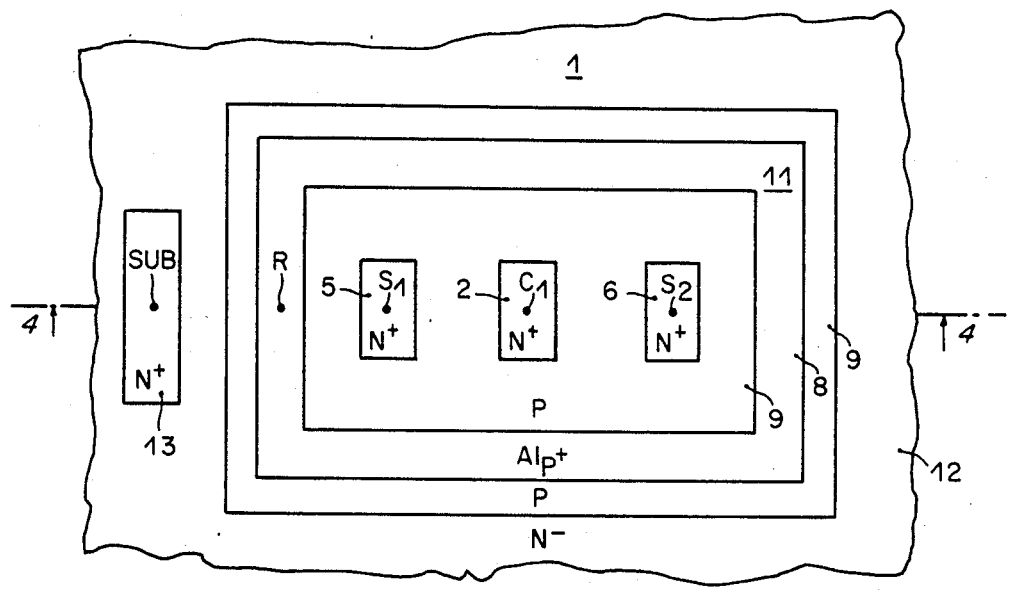
FIG. 3 shows a plan view of a first practical embodiment of the Hall element represented in FIGS. 1 and 2.
Figure 4:
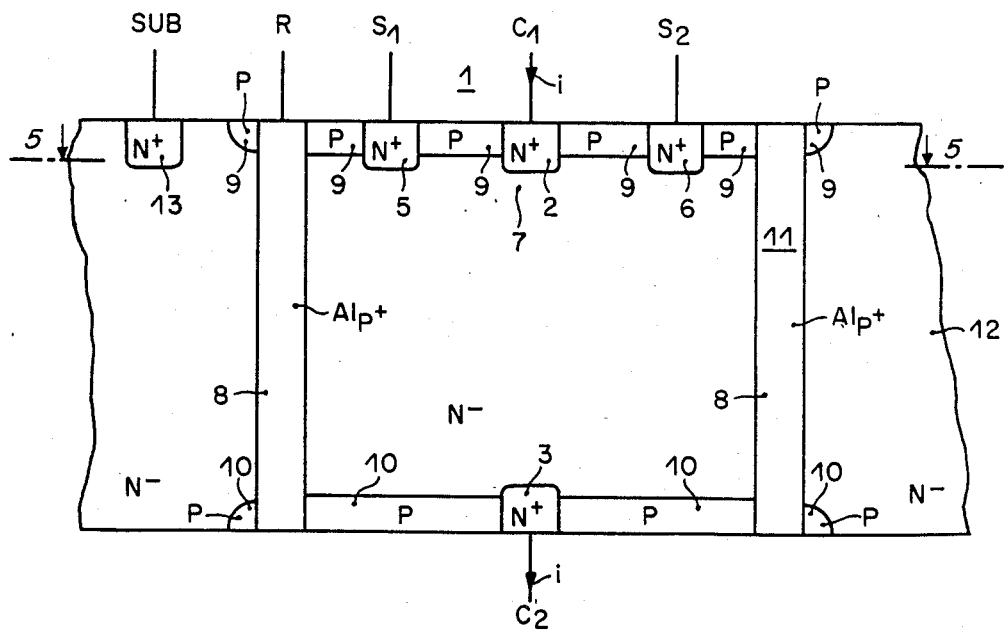
FIG. 4 shows a vertical cross-section through FIGS. 3 and 5 of the therein represented Hall elements.

FIGS. 3 and 4 show a plan view and a vertical cross-section of a first practical embodiment of the Hall element 1 illustrated in FIGS. 1 and 2. This Hall element is formed of a substrate 12, which comprises an N⁻material. Substrate 12 is provided with a substrate connection contact 13 arranged on its surface. The substrate connection contact 13 is strongly doped with impurity atoms and has the same conductivity type (i.e.N⁺) as the substrate 12 and the active zone 7 of Hall element 1, which are both of an N material. The substrate connection contact 13 is provided with a substrate connection SUB. The construction of this Hall element 1 is similar to that represented in FIGS. 1 and 2, with the exception that ring 8 comprises $Al_{P+}$, i.e. a material strongly doped with aluminum impurity atoms of a conductivity type P. Also here, ring 8, the top covering zone 9 and the bottom zone 10 together form a shell 11 which completely surrounds the active zone 7 of Hall element 1 in all directions, with the exception of the current sensor connection contacts 2, 3, 5 and 6. Ring 8 crosses substrate 12 from its top surface to its bottom surface and may be manufactured, for instance, by using the thermomigration process. The thermomigration process has been described in the publication "Journal of Applied Physics", Vol. 48, No. 9, September 77, pages 3943 to 3949, "Lamellar Devices Processed by Thermomigration", T. R. Anthony and H. E. Cline.

Figure 5:
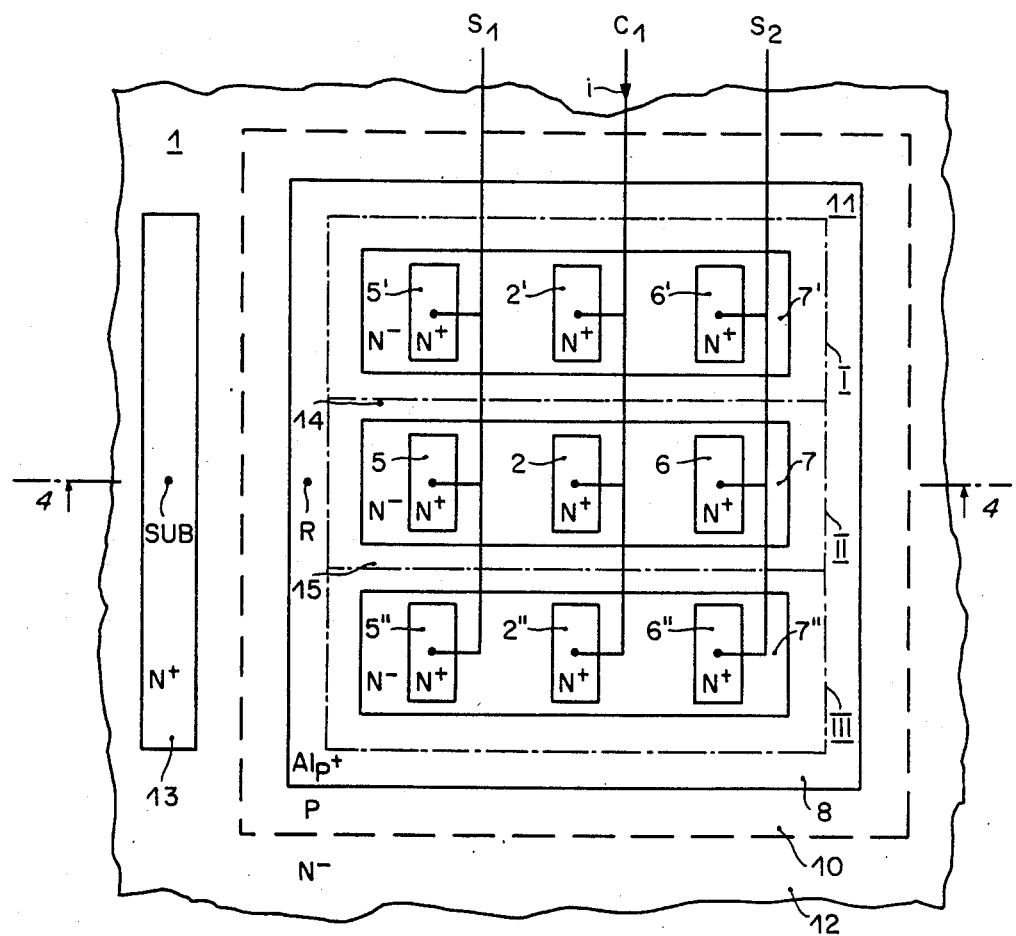
FIG. 5 shows a horizontal cross-section of a second practical embodiment of the Hall element illustrated in FIGS. 1 and 2.

FIGS. 5 and 4 show a horizontal and a vertical cross-section of a second practical embodiment of the Hall element represented in FIGS. 1 and 2 (i.e. FIG. 4 is also a cross-sectional view of FIG. 5). This second embodiment is an improved variant of the first embodiment and is also produced by the thermomigration process. FIG. 5 shows a cross-section of Hall element 1 that runs parallel to the surface of Hall element 1 directly beneath the top covering zone 9. (See FIG. 4.)

Hall element 1 represented in FIG. 5 is similar to that illustrated in FIG. 3, with the exception that current and sensor connection contacts 2, 3, 5 and 6 are provided multiple times. In FIG. 5 the current and sensor connection contacts 2, 3, 5 and 6 are provided three times so that three first current connection contacts 2, 2' and 2", three second current connection contacts 3, 3' and 3", three first sensor connection contacts 5, 5' and 5" and three second sensor connection contacts 6, 6' and 6" are provided. The three second current connection contacts 4, 4' and 4" cannot be seen in FIG. 5, as they are below the plane of the cross-section shown. The current and sensor connection contacts 2, 2', 2", 3, 3', 3", 5, 5' and 5", 6, 6' and 6" are all approximately of the same size and have the same configuration, for example, rectangular with rounded corners. They all comprise a material of the same conductivity type and are strongly doped with impurity atoms. In the embodiment illustrated, they are of an N+material. All current and sensor connection contacts designated by the same reference numerals 2, 2', 2" or 3, 3', 3" or 5, 5', 5" or 6, 6', 6" are connected to each other and to the corresponding current or sensor connection $C_1$ or $C_2$ or $S_1$ or $S_2$.

Ring 8 has intermediate zones 14, 15 that divide ring 8 into sub-rings lying next to each other, wherein one intermediate zone will always be common to both of the neighboring sub-rings. In FIG. 5, two intermediate zones 14 and 15 are provided that divide ring 8 into three sub-rings I, II and III. The intermediate connector 14 is common to the sub-rings I and II and the intermediate connector 15 is common to the sub-rings II and III. When ring 8 and its sub-rings I, II and III are rectangular (see FIG. 5), then all the current or sensor connection contacts 2, 2', 2" or 3, 3', 3" or 5, 5', 5" or 6, 6', 6" are arranged approximately in a straight line, i.e., the connection line of their center points forms an approximately straight line, and all the connection lines run parallel to each other. The distribution of ring 8 into the sub-rings I, II and III is in such a way that each sub-ring I or II or III laterally surrounds an active zone 7' or 7 or 7" with an attributed complete group 2', 3', 5', 6' or 2, 3, 5, 6 or 2", 3", 5", 6" of current and sensor connection contacts.

As can be seen in FIG. 5, P and N⁻ layers alternate in the proximity of the current and sensor connection contacts, so that the Hall element 1 has a "sandwich" form of construction. This "sandwich" construction has the advantage that the sensitivity of the width of the active zones 7, 7' and 7" to a voltage arising at the ring connection R, is larger by a factor m than in a Hall element 1 without intermediate zones, where m designates the number of sub-rings.

Figure 6:
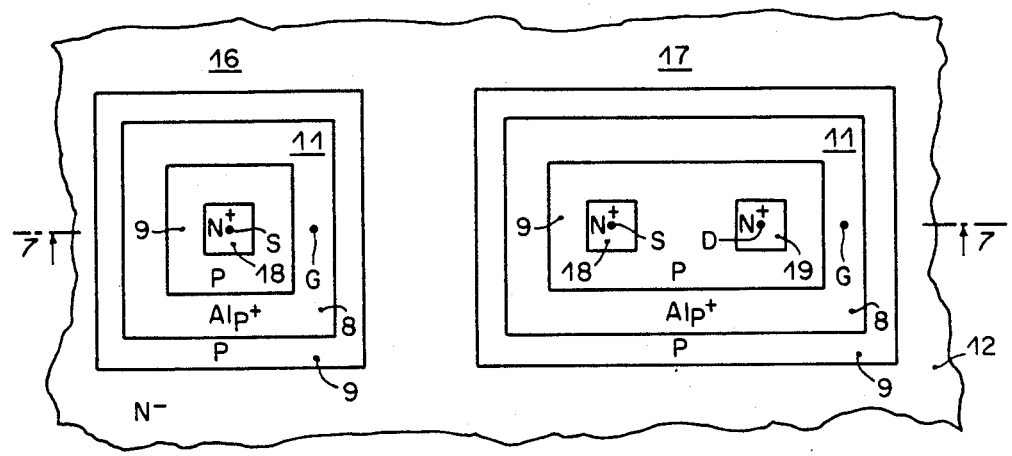
FIG. 6 shows a plan view of two variants of junction-field effect transistors which are manufactured by the same method as the Hall elements represented in FIGS. 3 to 5.
Figure 7:
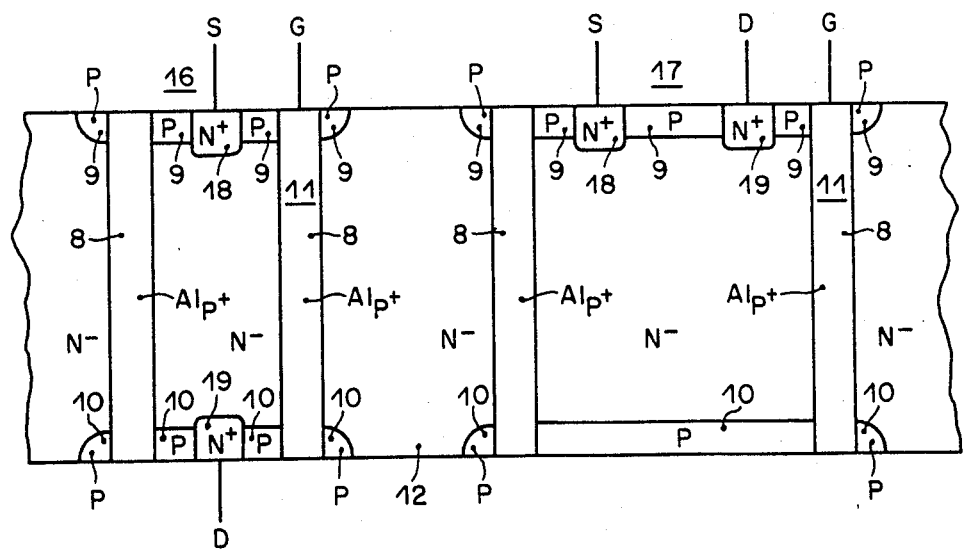
FIG. 7 shows a vertical cross-section through the barrier-layer-field effect transistors illustrated in FIG. 6.

FIGS. 6 and 7 show a plan view and a vertical cross-section of a first variant 16 and a second variant 17 of junction-field effect transistor also manufactured by the thermomigration process.

Both variants 16 and 17 differ in that, in the first variant 16, a "source" connecting contact 18 is arranged in the top covering zone 9 and a "drain" connecting contact 19 in the bottom zone, whereas in the second variant 17 the "source" connecting contact 18 and the "drain"-connecting contact 19 both are arranged in top covering zone 9. The construction of the first variant 16 is similar to that of the Hall element illustrated in FIGS. 3 and 4, in which the sensor connecting contacts 5 and 6 are missing and the current connecting contacts 2 and 3 have been replaced by the "source" and "drain" connecting contacts 18 and 19. The construction of the second variant 17 is similar to that of Hall element 1 illustrated in FIGS. 3 and 4, where the current connecting contacts 2 and 3 are missing and the sensor-connecting contacts 5 and 6 are replaced by the "source" and "drain" connecting contacts 18 and 19. In both variants 16 and 17, the ring connection, which has been designated by a G, represents the "gate" connection of the barrier-layer field effect transistor.

A comparison between FIGS. 3 and 4 and FIGS. 6 and 7 shows a Hall element and a barrier-layer-field-effect transistor that are similarly constructed so that it is possible to build both types of elements into a single integrated circuit by means of a thermomigration process in order to construct the circuit illustrated in FIG. 18.

Figure 10:
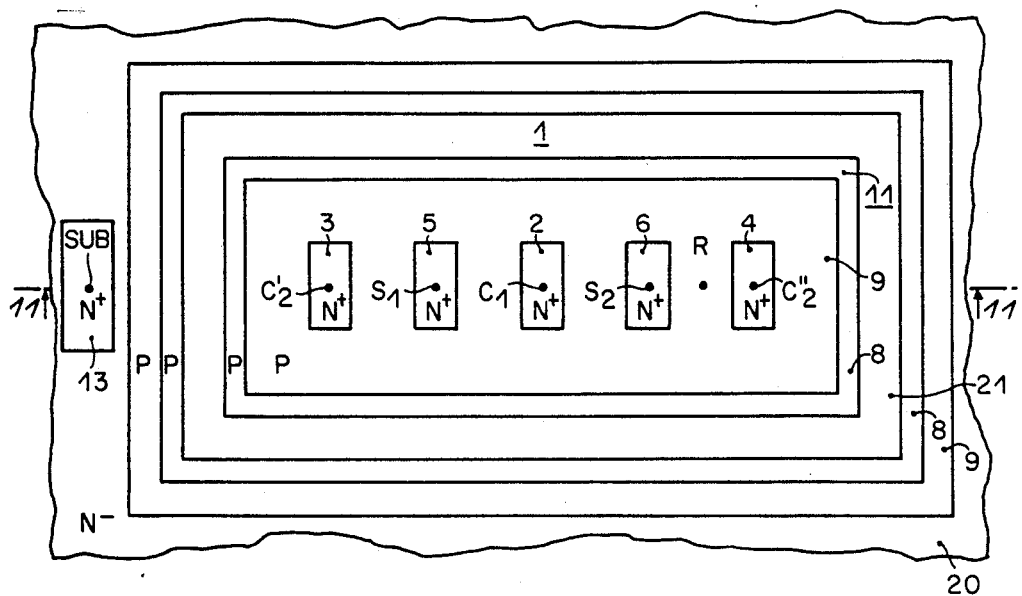
FIG. 10 shows a plan view of a first practical embodiment of the Hall element represented in FIGS. 8 and 9.
Figure 11:
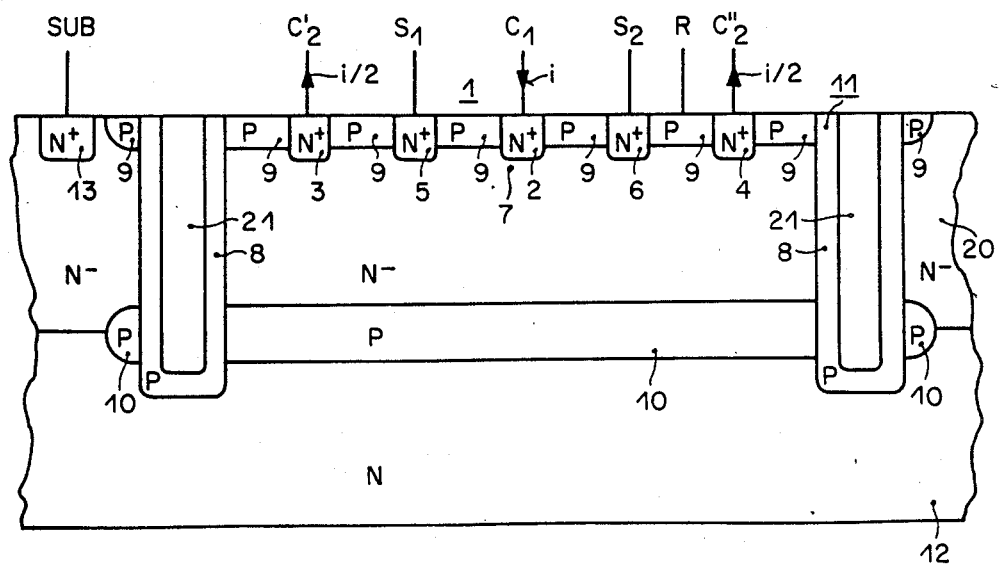
FIG. 11 shows a vertical cross-section through the Hall element represented in FIG. 10.

FIGS. 10 and 11 show a plan view and a vertical cross-section of a first practical embodiment of the Hall element 1 illustrated in FIGS. 8 and 9. The Hall element may, for instance, comprise a layer 20 of an N⁻ material which was formed onto a substrate 12 of N material. Layer 20 has a substrate connection contact 13 arranged on its surface which is of a material strongly doped with impurity atoms, and which has the same conductivity type as layer 20, the substrate 12 and the active zone 7 of Hall element 1, i.e. N-type conductivity. The active zone 7 here comprises the N⁻material of layer 20.

The substrate connecting contact 13 has a substrate connection SUB. The construction of Hall element 1 is similar to that illustrated in FIGS. 8 and 9, with the exception that ring 8 comprises a surface layer of P material applied all around on a ring-shaped carrier 21 of $SiO_2$ or polysilicon. The surface layer 8 of P material is missing on carrier 21 only at the top surface of the integrated circuit. The ring-shaped carrier 21 and the surface layer 8 cross layer 20 throughout from its top surface to the interface with substrate 12, into which they penetrate. The ring-shaped carrier 21 with its surface layer 8 may be produced, for example, by the anisotropic trench etching process which has been described in the publication "Electronics Week", July 23, 1984, pages 123 to 126, "1MB Memories Demand New Design Choices", White, Armstrong and Rao". The bottom zone 10 rests as a buried layer at the border between layer 20 and the substrate 12 and is in electrical contact with surface layer 8, which also is in electrical contact with top covering zone 9.

Figure 12:
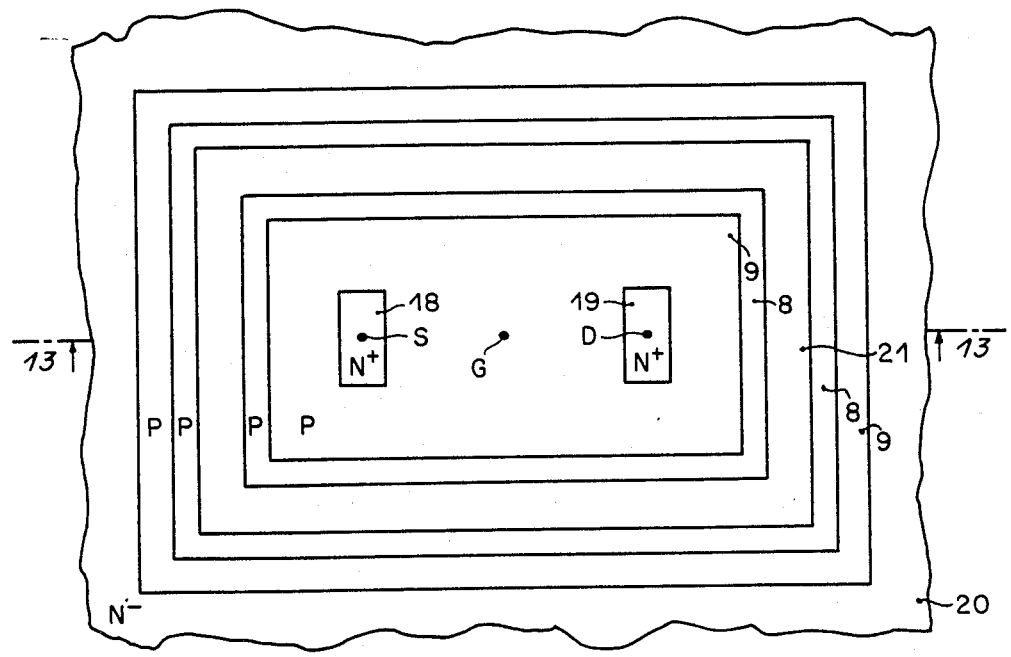
FIG. 12 shows a plan view of a barrier-layer-field effect transistor manufactured by the same method as the Hall element illustrated in FIGS. 10 and 11.
Figure 13:
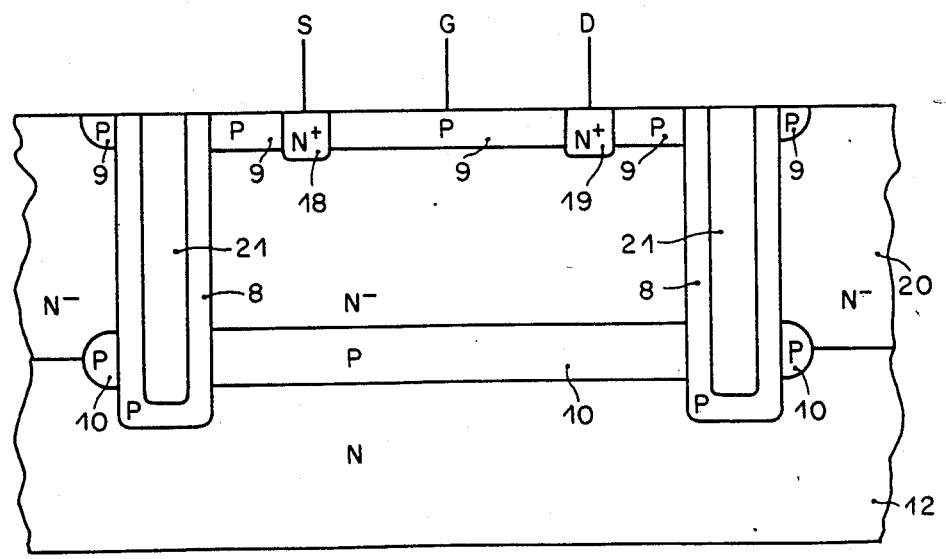
FIG. 13 shows a vertical section through the junction-field-effect transistor.

FIGS. 12 and 13 show a plan view and a vertical cross-section of a junction-field-effect transistor produced by the anisotropic trench etching process. The construction is similar to that of the Hall element illustrated in FIGS. 10 and 11, with the exception that instead of five connecting contacts 2 to 6 there are only provided two connection contacts, namely a source and a drain connecting contact 18 and 19. The ring connection herein has been designated by a G and constitutes the gate connection of the junction-field effect transistor. A comparison between FIGS. 10 and 11, on the one hand, and FIGS. 12 and 13, on the other hand, shows, the Hall element and the junction-field effect transistor are constructed in a similar manner so that it is possible without any major difficulty to build both types of elements, into a single integrated circuit by means of the anisotropic trench etching process to realize the circuit illustrated in FIG. 18.

Figure 14:
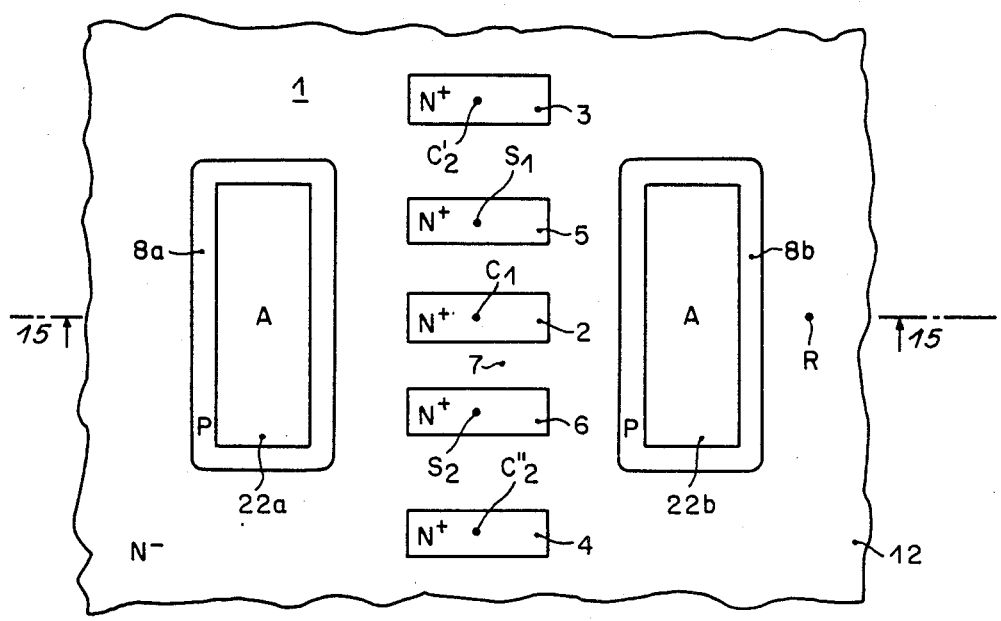
FIG. 14 shows a horizontal cross-section of a second practical embodiment of the Hall element represented in FIGS. 8 and 9.
Figure 15:
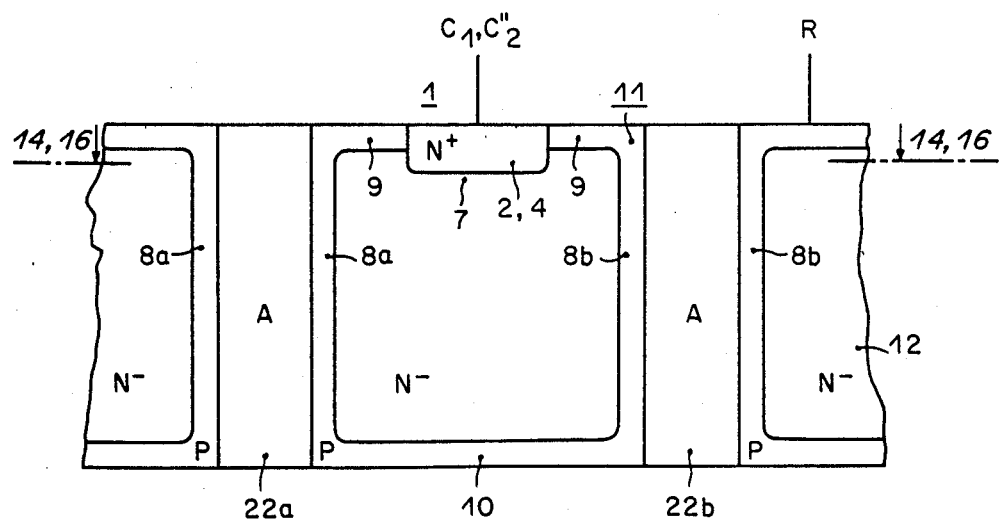
FIG. 15 shows a vertical cross-section through the Hall elements represented in FIGS. 14 and 16.

FIGS. 14 and 15 show a horizontal and a vertical cross section of a second practical embodiment of the Hall element 1 illustrated in FIGS. 8 and 9. Since it is very difficult to manufacture the deep and thin carrier 21 shown in FIGS. 12 and 13, the embodiment of FIGS. 14 and 15 may represent an improvement of the embodiment of FIGS. 12 and 13. FIG. 14 shows a cross-section of Hall element 1, that is taken parallel to its surface, directly below the covering zone 9. (See FIG. 15.) Apart from the number of current and sensor connecting contacts 2 to 6, which here equals five, the Hall element 1 illustrated in FIGS. 14 and 15 is constructed in a manner similar to that of the Hall element illustrated in FIGS. 3 and 4. The Hall element 1 of FIGS. 14 and 15 is formed from a substrate 12, which comprises an $N^-$ material, so that the active zone 7 of the Hall element 1 is also of an $N^-$ material. Unlike the Hall element 1 represented in FIGS. 3 and 4, the rectangularly shaped ring 8 here comprises only two sides lying diametrically opposite each other which are each formed from a surface layer 8a or 8b of a P material. The surface layers 8a and 8b completely cover the inside surfaces of the rectangular air shafts 22a or 22b. The letter A in FIGS. 14 and 15 designates air. The two air shafts 22a and 22b traverse the substrate 12, starting from the top surface and terminating at the bottom. The shaft surface layers 8a and 8b may, for example, be produced by the diffusion of gas into the substrate 12 where it gives rise to the surface layers 8a and 8b. The surface layers 8a and 8b, the top covering zone 9 and the bottom zone 10 are all of a material with the same type of conductivity, namely type P, and of a conductivity type opposite to that of active zone 7 of Hall element 1 and substrate 12 which both, as already mentioned, comprise an $N^-$ material The P-N junction between the surface layers 8a and 8b, the covering zone 9, the bottom zone 10 (which for example are P-type), and the active zone 7 (which for example is N type) of Hall element 1, forms a barrier which surrounds the active zone 7 on four sides while leaving two sides of the active zone 7 unbounded by the P-N junction.

Figure 16:
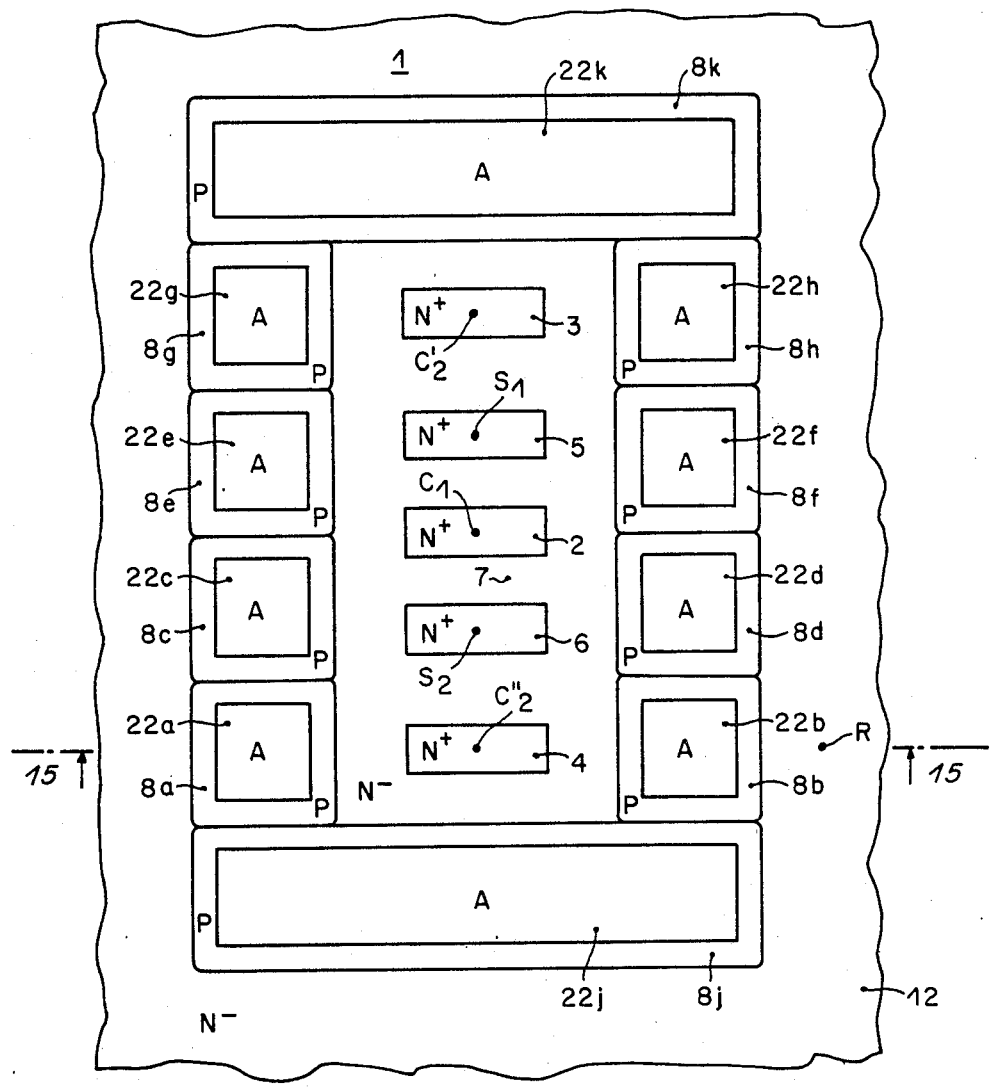
FIG. 16 shows a horizontal cross-section of a third practical embodiment of the Hall element represented in FIGS. 8 and 9.

In order to avoid the disadvantage which occurs when two sides of the active zone 7 are not bounded by the P-N junction, the configuration of FIG. 16 may be used. This configuration comprises a minimum of four surface layers 8a, 8b, 8j and 8k. The surface layers 8a, 8b, 8j and 8k, the top covering zone 9 and the bottom zone 10 all are in electric contact with each other and, together, form a barrier which completely surrounds the active zone 7 of Hall element 1 on all sides. The surface layers 8a, 8b, 8j and 8k, the covering zone 9 and the bottom zone 10 are all formed from a material of the same type of conductivity, for instance, P-type material.

If the air shafts 22a, 22b, 22j or 22k are too long, there exists the danger that the Hall element will bend under the effect of an extreme mechanical pressure, or even break. In order to prevent this from happening, these long air shafts may be subdivided into parallel partial air shafts. In FIG. 16, two diametrically opposite air shafts which extend parallel to an imaginary line, connecting the centers of contacts 2 to 6 would be too long. Thus (as shown in FIG. 16), the two long air shafts are subdivided, by intermediate partitions which extend perpendicular to this imaginary line, into four approximately equally large partial air shafts 22a, 22c, 22e and 22g, and 22b, 22d, 22f and 22h. The inner surfaces of these partial shafts are wholly covered with surface layers 8a, 8b, 8c, 8d, 8e, 8f, 8g, and 8h. The surface layers 8a to 8h, the covering zone 9, the bottom zone 10 and, if air shafts 22j and 22k are provided, the surface layers 8j and 8k, will all be in electric contact with each other. They, together, will form an unbroken surface which completely surrounds the active zone 7 of Hall element 1, laterally, on top, and on the botton.

The Hall elements 1 illustrated in FIGS. 8 to 11 and 14 to 16 with five current or sensor connectors $C_1$, $C'_2$, $C''_2$, $S_1$ and $S_2$ are to be switched externally as represented in FIG. 17. A magnetic field $H_N$, which is to be measured, is oriented parallel to the surface of the integrated circuit containing Hall element 1. A pole $V_{DD}$ of a supply voltage $V_{DD}$; $V_{SS}$ is connected to the central current connection $C_1$ by way of a current source 23, while the other pole $V_{SS}$ of the supply voltage $V_{DD}$; $V_{SS}$ is connected, through a resistance $R_1$ or $R_2$, to the two other current connections $C'_2$ or $C''_2$. The current i, source supplied by the current source 23 of the Hall element 1, is divided in half inside Hall element 1 and in each case exits as current i/2 throgh the two resistances $R_1$ and $R_2$ of Hall element 1.

The apparatus illustrated in FIG. 18 comprises, in addition to the Hall element 1 and the current source 23, a control circuit 24; 25; 26; 27. In FIG. 18 it is assumed that the Hall element 1 is one of the Hall elements 1 represented in FIGS. 1 to 5 which all, besides the ring connection R, have only four current or sensor connections $C_1$, $C_2$, $S_1$ and $S_2$. In this case, the two current connections $C_1$ and $C_2$ are each connected to one pole of the current source 23. If, however, the Hall element represented in FIG. 18 is one of the Hall elements illustrated in FIGS. 8 to 11 or 14 to 16, which all, besides the ring connection R, have five current or sensor connections $C_1$, $C'_2$, $C''_2$, $S_1$ and $S_2$, then, as already mentioned, the circuit represented in FIG. 17 is to be used for the Hall element 1. In both cases one of two sensor connections, for instance the second sensor connection $S_2$, is grounded, while the other sensor connection $S_1$ forms the output of Hall element 1.

In all of the Hall elements 1 that have been described, the P-N junction between the ring 8, top covering zone 9, bottom zone 10 (which are for example P-type) and the active zone 7 (which is for example N-type) defines a space-charge barrier that desirably wholly surrounds the active zone 7 of Hall element 1, and whose thickness can be controlled by means of an electric voltage connected to ring connection R. The P-N junction barrier isolates and completely protects the active zone 7 of Hall element 1 so that it is superfluous to provide an insulating layer of silicon dioxide. Thus the variable number of charge carriers that is always present in such an insulating layer of silicon dioxide is not present in the devices of the present invention, and therefore such charge carriers cannot adversely affect the long-time stability of the Hall element 1. The protective action of the space charge barrier depends on how completely it surrounds the active zone 7 of Hall element 1 and also depends on its thickness. Despite the existence of any possible disturbing influences, for instance, changing ambient temperature, such thickness should always be constant. In order to achieve this, the Hall element 1, as illustrated in FIG. 18, should be controlled by a control circuit 24; 25; 26; 27 which regulates the thickness of the P-N junction barrier to keep it at a constant value.

In FIG. 18, the output $S_1$ of Hall element 1 is connected through a control circuit 24; 25; 26; 27 to a ring connection R of Hall element 1. The control circuit 24; 25; 26; 27 comprises at least one actual value generator 24, a should-be value generator 25 and a should-be value/actual value difference generator 26;27. The output $S_1$ of Hall element 1 is connected through the actual value editor 24 to a first input $E_1$ of the should be/actual value difference generator 26; 27, and the output of the should-be value generator 25 is directly connected to its second input $E_2$. The output of the should-be value/actual value difference generator 26; 27 is connected to ring connection R of Hall element 1. The actual value generator 24 is, in the simplest case, a rectifier, whose output current is always equal to the absolute value of its input voltage.

In FIG. 18 the actual value generator 24 comprises an inverting amplifier 30 and a switch 29 that is actuated by a control device 28. In FIG. 18, the actual value generator 24 has a voltage follower 31. Within the actual value generator 24, the output of voltage follower 31 may be connected directly or through inverting amplifier 30, depending on the position of the switch 29, to the input terminal $E_1$ of the difference generator 26, 28. The input of the actual value generator 24 is connected directly, or through the voltage follower 31, to the input of the controlling mechanism 28 whose output controls actuation of switch 29. The control mechanism 28 may, for example, comprise a comparator which detects th polarity of the input voltage of the actual value generator 24, and thereby also the polarity of the output voltage $V_H$ of Hall element 1. Depending on the polarity of the output voltage $V_H$ the switch 29 connects or disconnects the inverting amplifier 30. In other words: if the output voltage $V_H$ of Hall element 1 is positive, it will be connected to input $E_1$ without sign change, and if $V_H$ is negative, it will be connected to input $E_1$ after inverting amplifier 30 changes its sign.

The should-be value generator 25 may, for example, comprise a series circuit comprising a pre-resistance R' and the "Source-Drain" path of a field effect transistor 32 whose joint pole forms the output of the should-be value generator 25, and thereby the second input $E_2$ of the should-be value/actual value difference generator 26; 27. The other pole of the pre-resistance R' is connected to a first reference voltage $V_{Ref,1}$, the "gate" connection of the field effect transistor 32 is connected to a second reference voltage $V_{Ref,2}$ and the other pole of the "Source-Drain" path of the field-effect transistor 32 is connected to a third reference voltage $V_{Ref,3}$.

The should-be value/actual value difference generator 26; 27 comprises at least one differential amplifier 26 which may, for example be constructed in a known manner with the aid of an operational amplifier 33. In this case, the inverting input of the operational amplifier 33 is connected a first input resistance $R_3$ connected to the first input $E_1$, a second input resistance $R_4$ connected to the second input $E_2$, and a return feedback resistance $R_5$ connected to output F of the differential amplifier 26. Output F is simultaneously the output of operational amplifier 33. The non-inverting input of operational amplifier 33 comprises a third input $E_3$ of the differential amplifier 26, which is connected to a fourth reference voltage $V_{Ref,4}$. The differential amplifier 26 may, for example, be an inverting amplifier. In this case, a further amplifier 27 has to be connected to it, for reversing the sign change caused by differential amplifier 26. The two amplifiers 27 and 30 may, for instance, each have a gain factor of $-1$ and may both comprise a single operational amplifier with appropriate input and feedback resistors.

The field effect transistor 32 serves as the temperature-sensitive element, whose saturation ("pinch off") voltage is inversely proportional to the square of the ambient temperature. Since both Hall element 22 and field effect transistor 32 are formed in the same integrated circuit and lie close to one another, the ambient temperature for both devices is the same. This again shows how important it is that the Hall element 1 and the field effect transistor 32 be integrated in the same semiconductor crystal by means of the same technology.

The control circuit 24; 25; 26; 27 controls the width of the depletion region formed by the P-N junction between ring 8, top over zone 9, bottom zone 10, on the one hand, and the active zone 7, on the other hand. The output voltage of Hall element 1, i.e. the actual value, is compared with the should-be value supplied by the should-be value generator 25. The difference between the should-be value and the actual value is amplified and is then connected to the ring connection R of Hall element 1. As the field effect transistor 32 is a temperature-sensitive component, so also the should-be value is dependent on temperature. This enables the controlling circuit 24;25; 26;27 to adjust the thickness of the P-N junction barrier to a level which allows the magnetic field sensitivity of the Hall element to remain independent of temperature. If the Hall temperature is temperature-stable per se, the field effect transistor 32 is superfluous and may be omitted.

The switch 29 has, in FIG. 18, been represented as a relay contact. In practice, however, as a rule, this will be a semiconductor switch, for instance, of a type that may be implemented in CMOS-Technology. The transistors used in controlling circuit 24;25;26;27, like the field transistor 32, may, for instance, have the configuration illustrated in FIGS. 6 and 7 or 12 and 13.

Figure 19:
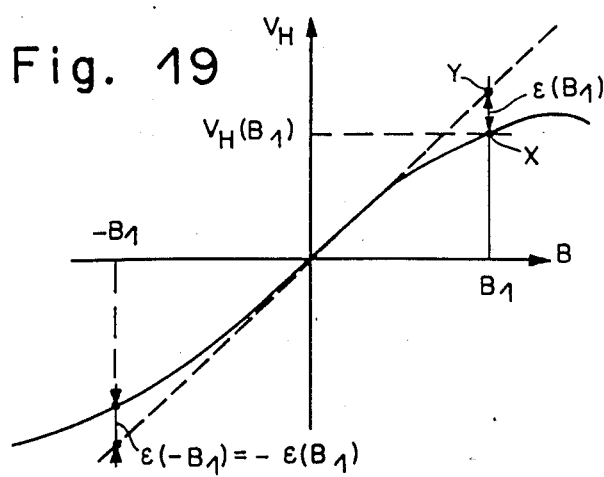
FIG. 19 shows a characteristic curve $V_H=f(B)$ of the output voltage $V_H$ of a Hall element as a function of a known induction B at a given supply current i.

The circuit illustrated in FIG. 18 has the additional advantage that it can linearize the characteristic curve $V_H = f(B)$ of Hall element 1, wherein even parity as well as odd-parity non-linearities are compensated. The definition of non-linearity can be deduced from FIG. 19 in which non-linear characteristic curve $V_H = f(B)$ for a given supply current i has been illustrated. The linearized characteristic curve has been represented in FIG. 19 by a dotted line. At a value $B = B_1$ of induction B, the non-linear characteristic curve of the Hall current $V_H$ has a value X equal to $V_H(B_1)$, while the corresponding ordinate on the linear characteristic curve 10 has a value $Y=[\delta V_H/\delta B]_{B=0}°B_1$ wherein the factor $[\delta V_H/\delta B]_{B=0}$ equals the slope of the non-linear and the linear characteristic curves at the zero point B=0. The non-linearity $\epsilon(Bl)$, at a value $B=B_1$ is defined as the difference between the two ordinates Y and X. This means: $\epsilon(B_1)=[\delta V_H/\delta B]_{B=0}°B_1-V_H(B_1)]$ The non-linearity is of an even-parity type, if $\epsilon(B)=\epsilon(-B)$ (See FIG. 20). The non-linearity is of an odd-parity type, when: $\epsilon(B)=-\epsilon(-B)$ The non-linearity represented in FIG. 19 is of an odd type. Whether the non-linearity of a given Hall element 1 is of an even or odd-parity type needs to be ascertained, for instance, by means of a measurement, before insertion of the Hall element 1 in the circuit represent in FIG. 18. The following description is valid under the assumption that, for positive values of induction B there will also correspond positive values for the output voltage $V_H$ of the Hall element 1, and negative values of the output voltage $V_H$ will correspond to negative values of induction B. (See FIG. 19.)

Figure 20:
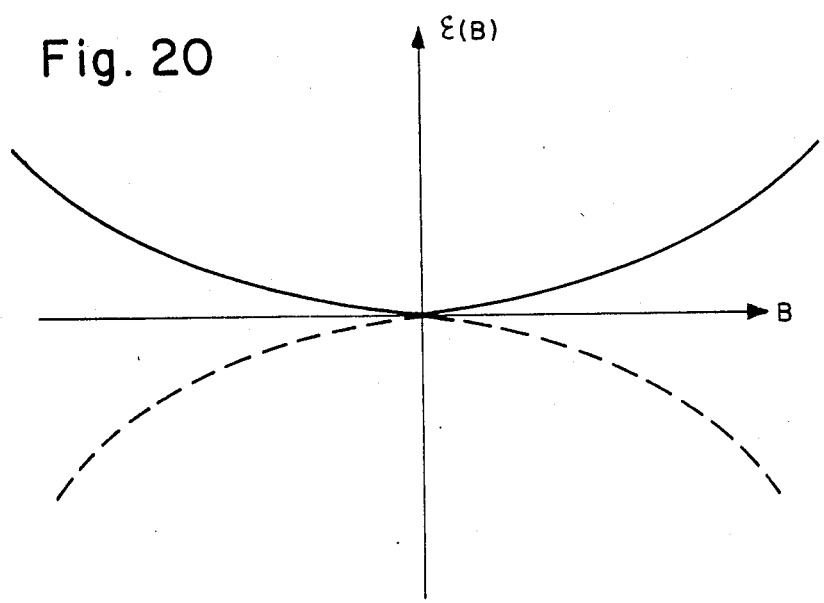
FIG. 20 shows characteristic curves of even-parity non-linearities $\epsilon(B)$.

Generally, in a Hall element with an even-parity type non-linearity, the non-linearity $\epsilon(B)$ as a function of induction B is either always positive, as illustrated in FIG. 20 by a solid line characteristic curve, or always negative, as represented in FIG. 20 by a dotted line characteristic curve.

Figure 21:
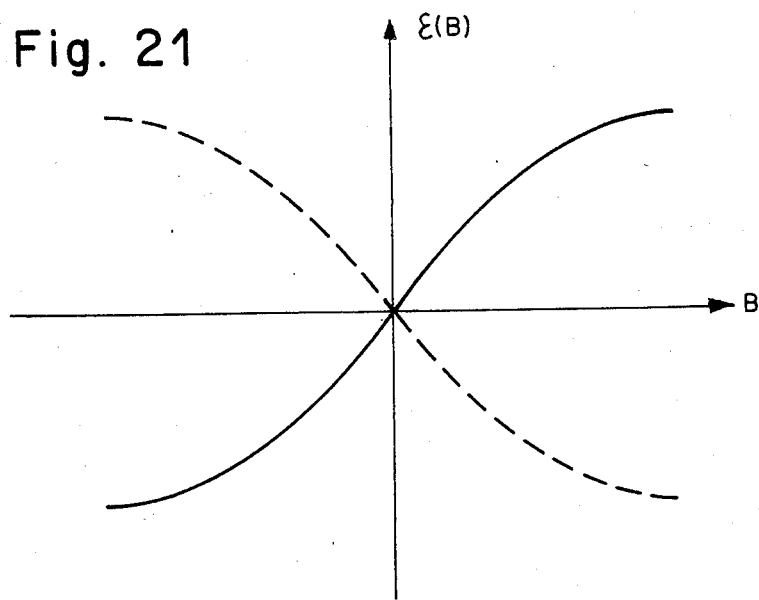
FIG. 21 shows characteristic odd-parity non-linearities $\epsilon(B)$.

Generally, in a Hall element with an odd-parity type non-linearity, the non-linearity $\epsilon(B)$ as a function of induction B is, as represented in FIG. 21 by the solid-line characteristic curve, positive for the positive values of B and negative for negative values of B, or vice-versa, as represented in FIG. 21 by a dotted-line characteristic curve, negative for positive values of B, and positive for negative values of B.

If the Hall element 1, in an ideal way, is of an even-parity type, then the fourth input $E_4$ of the differential amplifier 26 is not used, i. e., the connection represented in FIG. 18 by the dotted line between the output of the voltage amplifier 31 and the fourth input $E_4$ of the differential amplifier 26 is left out, and only the absolute value of the output voltage $V_H$ of the Hall element 1, generated by the actual value generator 24, is connected to the first input $E_1$ of the differential amplifier 26.

If, in this case, the Hall element 1 has a characteristic curve similar to that which, in FIG. 20, has been represented as the solid line, and on the condition that the voltage amplifier 31 has a positive gain factor +1, amplifier 27 has to be an inverting amplifier so that the series circuit 24; 26; 27 will not cause any inversion of voltage. If, however, the Hall element 1 has a characteristic curve similar to that which in FIG. 20 has been represented as a dotted line, then amplifier 27, given the same pre-conditions, has to be a non-inverting amplifier so that the series circuit 24;26;27 causes a voltage inversion.

If the Hall element ideally is of an odd-parity non-linearity type, then the control device 28, the switch 29 and the inverting amplifier 30 may be left out, i.e., no absolute value is formed for the output voltage $V_H$ of Hall element 1, and the output voltage $V_H$ is connected via voltage amplifier 31 and an optional connection, represented in FIG. 18 as a dotted line, to the fourth input $E_4$ of the differential amplifier 26. The fourth input $E_4$ is connected through a third input resistance $R_6$ to an inverting input of the operational amplifier 33.

If, in this case, the Hall element 1 has a characteristic curve similar to that represented in FIG. 21 as a solid line, and again under assumption that the voltage amplifier 31 has a positive gain of +1, the amplifier 27 has to be an inverting amplifier so that the series circuit 31;26;27 does not cause any inversion of voltage. If, however, the Hall element 1, has a characteristic curve similar to that which has been represented in FIG. 21 as a dotted line, then the amplifier 27, given the same pre-conditions, must be a non-inverting amplifier so that the series circuit 31;26;27 causes an inversion of voltage.

The characteristic curves represented in FIGS. 20 and 21 are ideal characteristic curves. In practice, these characteristic curves are not symmetrical or anti-symmetrical with respect to the (B)-axis, i.e., in practice, as a rule, there always exists a combination of even-parity and odd-parity non-linearities. In this case, the output voltage $V_H$ of Hall element 1 must reach the first input $E_1$ through the actual value generator 24, and the fourth input $E_4$ through the voltage follower 31. Since the even-parity and odd-parity non-linearities need not be of the same magnitude, they can be corrected unequally by the selection of differing values for the input resistances $R_3$ and $R_6$. Thus, the first and the fourth inputs, $E_1$ and $E_4$ of the differential amplifier 26 each form one of the two actual-value inputs. At the fourth input $E_4$, there always occurs the output voltage $V_H$ of Hall element 1 with its actual sign, while at the first input $E_1$ of differential amplifier 26 there always occurs the absolute value of this output voltage. The sum of the two voltages occurring at both inputs $E_1$ and $E_4$ of differential amplifier 26 forms the actual value of the controlling circuit 24;25;26;27.

Summarizing, the mode of operation of the circuit illustrated in FIG. 18 can be described as follows:The reference voltages $V_{Ref,1}$, $V_{Ref,2}$, $V_{Ref,3}$ and $V_{Ref,4}$ are selected in such a way that at the input of amplifier 27 there occurs a positive voltage, if amplifier 27 is inverting, and a negative voltage, if amplifier 27 is non-inverting, so that in both cases a negative basic voltage occurs at the control input R of Hall element 1. If the magnetic field measured by means of Hall element 1 is a sine-shaped alternating magnetic field, then the output voltage $V_H$ of Hall element 1 is a sine-shaped voltage. In a Hall element 1 with an ideal odd-parity non-linearity, this sine-shaped AC voltage $V_H$ is conducted unchanged to the fourth input $E_4$ of the differential amplifier 26 as the actual value. Then, depending on whether amplifier 27 has positive or negative gain, comparison with the should-be value is made with or without inversion in such a way that the negative current at the control input R of Hall element 1 becomes more or less negative as needed. The total voltage at control input R, in any case, has to remain negative.

The same occurs in a Hall element with ideal even-parity non-linearity, with the exception that this time the half-waves of output voltage $V_H$ of Hall element 1 are rectified by means of the switch 29 and of the inverting amplifier 30, and the thus rectified output voltage $V_H$ is conducted to the first input $E_1$ of the differential amplifier 26 as the actual value. If the gain factor of the inverting amplifier 30 is $-1$, then the rectified negative half-waves are as large as the positive half-waves. In a Hall element 1 with unsymmetrical non-linearities, i.e. when a combination of even-parity and odd-parity non-linearities occurs the actual value must be a combination of both the abovementioned actual values, i.e. the unchanged output voltage $V_H$ must be connected to input $E_4$ and the rectified output voltage $V_H$ must simultaneously be connected to input $E_1$. In this case the sum of the weighted output voltage $V_H$ and the weighted rectified output voltage $V_H$ becomes effective as the total actual value, wherein the values of the input resistances $R_6$ or $R_3$ in each case form the weighting factors.

Since in a given magnetic field the output voltage $V_H$ of Hall element 1 is approximately inversely proportional to the thickness of the barrier region, and such thickness is proportional to the voltage which occurs at the control input R, the non-linearity of the output voltage $V_H$ may be corrected, if the voltage at the control input R of Hall element 1 is changed in the right direction by appropriate regulation.

Finally, the above described embodiments of the invention are intended to be illustrative only. Numerous alternative embodiments may be devised by those skilled in the art without departing from the spirit and scope of the claims which follow.

We claim:

1. An electronic device comprising a first Hall element, said first Hall element comprising
    a substrate including a first semiconductor material and having top and bottom major surfaces;
    a top zone of a second semiconductor material having a conductivity of a first type defined in said substrate and including the top major surface of said substrate;
    a bottom zone of a third semiconductor material having a conductivity of the first type defined in said substrate and spaced apart from said top zone;
    first and second sensor connection contacts at the top major surface of said substrate and extending therefrom into a first portion of said substrate between said top and bottom zones;
    a first current connection contact at the major top surface of said substrate and extending therefrom into the first portion of said substrate between said top and bottom zones;
    a second current connection contact at one of the major surfaces of said substrate in one of said top and bottom zones and extending therefrom into the first portion of said substrate between said top and bottom zones;
    said first and second sensor connecting contacts and said first and second current connection contacts being interrelated so that a first current source connected to said first and second current connection contacts in the presence of a first magnetic field component substantially parallel to the top major surface of said substrate produces a first Hall voltage between said first and second sensor connection contacts and a first part of said substrate between said top and bottom zones primarily involved in producing the first Hall voltage defines a first active zone between said top and bottom zones;
    said first active zone having a conductivity of a second type opposite to the conductivity of the first type;
    a first annular zone of a fourth semiconductor material having a conductivity type of the first type defined in said substrate surrounding said first active zone and extending between said top and bottom zones, said first annular zone being strongly doped with aluminum impurity atoms; and
    an electrical connection in electrical contact with said first annular zone;
    said first annular zone being an electrical contact with said top and bottom zones, and said first and second sensor connection contacts and said first and second current connection contacts being in electrical contact with said first active zone.

2. The electronic device of claim 1, wherein said second current connection contact is at the top major surface of said substrate and further comprising second and third Hall elements adjacent to said first Hall element,
    said second Hall element comprising third and fourth sensor connection contacts at the top major surface of said substrate and extending therefrom into a second portion of said substrate between said top and bottom zones;
    third and fourth current connection contact at the top major surface of said substrate and extending therefrom into the second portion of said substrate between said top and bottom zones;
    said third and fourth sensor connection contacts and said third and fourth current connection contacts being interrelated so that a second current source connected to said third and fourth current connection contacts in the presence of a second magnetic field component substantially parallel to the top major surface of said substrate produces a second Hall voltage between said third and fourth sensor connection contacts and a second part of said substrate between said top, and bottom zones, primarily involved in producing the second Hall voltage defines a second active zone;
    said second active zone having a conductivity of a second type opposite to the conductivity of the first type; and
    a second annular ring of a fifth semiconductor material having a conductivity of the first type defined in said substrate surrounding said second active zone and extending between said top and bottom zones, said second annular zone being strongly doped with aluminum impurity atoms;
    said second annular zone being in electrical contact with said top and bottom zones, and said third and fourth sensor connection contacts and said third and fourth current connection contacts being in electrical contact with said second active zone;
    said first and second annular zones having a common portion between said first and second Hall elements;
    said third Hall element comprising fifth and sixth sensor connection contacts at the top major surface of said substrate and extending therefrom into a third portion of said substrate between said top and bottom zones;
    fifth and sixth current connection contacts at the top major surface of said substrate and extending therefrom into the third portion of said substrate between said top and bottom zones;
    said fifth and sixth sensor connection contacts and said fifth and sixth current connection contacts being interrelated so that a third current source connected to said fifth and sixth current connection contacts in the presence of a third magnetic field component substantially parallel to the top major surface of said substrate produces a third Hall voltage between said fifth and sixth sensor connection contacts and a third part of said substrate between said top and bottom zones primarily involved in producing the third Hall voltage defines a third active zone;

said third active zone having a conductivity of a second type opposite to the conductivity of the first type; and a third annular zone of a sixth semiconductor material having a conductivity of the first type defined in said substrate surrounding said third active zone and extending between said top and bottom zones, said third annular zone being strongly doped with aluminum impurity atoms;

said third annular zone being in electrical contact with said top and bottom zones, and said fifth and sixth sensor connection contacts and said fifth and sixth current connection contacts being in electrical contact with said third active zone;

said third annular zone having a portion in common with said first annular zone in the region between said first and third Hall elements;

said second current connection contact being at the top major surface of said substrate;

means to connect said first, third and fifth sensor connection contacts electrically;

means to connect said second, fourth and sixth sensor connection contacts electrically;

means to connect said first, third and fifth current connection contacts electrically, and means to connect said second, fourth and sixth current connection contacts electrically.

3. An electronic device comprising a Hall element, said Hall element comprising a substrate including a first semiconductor material and having a top major surface;

a semiconductor layer of a second semiconductor material defined in said substrate and including the top major surface of said substrate;

a top zone of a third semiconductor material having a conductivity of a first type defined in said semiconductor layer and including the top major surface of said substrate;

a bottom zone of a fourth semiconductor material having a conductivity of the first type defined in said semiconductor layer and spaced apart from said top zone;

first and second sensor connection contacts at the top major surface of said substrate and extending therefrom into a portion of said semiconductor layer between said top and bottom zones;

first, second and third current connection contacts at the top major surface of said substrate and extending therefrom into the portion of said semiconductor layer between said top and bottom zones;

said first and second sensor connection contacts and said first, second and third current connection contacts being arranged substantially symmetrically along a line with said first current contact at the center, said second and third current connection contacts on opposite sides of said first current connection, said first sensor connection contact between said first and second current connections and said second sensor connection contact between said first and third current connection contacts;

said first and second sensor connecting contacts and said first, second and third current connection contacts being interrelated so that a current source connected to said first current connection contact and said second and third current connection contacts in the presence of a magnetic field component substantially parallel to the top major surface of said substrate produces a Hall voltage between said first and second sensor connection contacts and a part of said semiconductor layer between said top and bottom zones primarily involved in producing the Hall voltage defines an active zone;

said active zone having a conductivity of a second type opposite to the conductivity of the first type; and a first annular zone of a semiconductor material having a conductivity type of the first type defined in said semiconductor layer surrounding said active zone and extending from said top major surface of said substrate at least through said semiconductor layer;

said first annular zone being in electrical contact with said top and bottom zones and said first and second sensor connection contacts and said current connection contacts being in electrical contact with said active zone.

4. The electronic device of claim 3, further comprising a second annular zone defined in said semiconductor layer surrounding said active zone, embedded in said first annular zone, and extending from the top major surface of said substrate to at least to said bottom zone; said second annular zone comprising silicon oxide or polysilicon.

5. The electronic device of claim 3, wherein said substrate and said semiconductor layer comprise semiconductor material of the same conductivity type.

6. An electronic device comprising a Hall element, said Hall element comprising a substrate including a first semiconductor material and having a top major surface;

a top zone of a second semiconductor material having a conductivity of a first type defined said substrate, and including the top major surface of said substrate;

a bottom zone of a third semiconductor material having a conductivity of the first type defined in said substrate and spaced apart from said top zone;

first and second sensor connection contacts at the top major surface of said substrate and extending therefrom into a portion of said substrate between said top and bottom zones;

first, second and third current connection contacts at the top major surface ofsaid substrate and extending therefrom into the portion of said substrate between said top and bottom zones;

said first and second sensor connection contacts and said first, second and third current connection contacts being arranged substantially symmetrically along a line with said first current contact at the center, said second and third current connection contacts on opposite sides of said first current connection, said first sensor connection contact between said first and second current connections, and said second sensor connection contact between said first and third current connection contacts;

said sensor connection contacts and said current connection contacts being interrelated so that a current source connected to said first current connection contact and said second and third current connection contacts in the presence of a magnetic field component substantially parallel to the top major surface of said substrate produces a Hall voltage between said first and second sensor connection contacts and a part of said substrate betwen said top and bottom zones primarily involved in producing the Hall voltage defines an active zone;

said active zone having a conductivity of a second type opposite to the conductivity of the first type;

a first annular zone of a semiconductor material having a conductivity type of the first type surrounding said active zone and extending between said top and bottom zones;

said first annular zone being in electrical contact with said top and bottom zones and said first and second sensor connection contacts and said first, second and third current connection contacts being in electrical contact with said active zone;

at least one air shaft at opposite sides of the line of said sensor and current connection contacts; each of said air shafts extending from the top major surface of said substrate entire through said substrate; each of said air shafts having a generally rectangular cross section; and a surface zone of semiconductor material having a conductivity of the first type on the inner surface of each of said air shafts.

7. An electronic device comprising a Hall element, said Hall element comprising a substrate including a first semiconductor material and having a top major surface;

a top zone of a second semiconductor material having a conductivity of a first type defined said substrate and including the top major surface of said substrate;

a bottom zone of a third semiconductor material having a conductivity of the first type defined in said substrate and spaced apart from said top zone;

first and second sensor connection contacts at the top major surface of said substrate and extending therefrom into a portion of said substrate between said top and bottom zones;

first, second and third current connection contacts at the top major of said substrate and extending therefrom into the portion said substrate between said top and bottom zones;

said first and second sensor connection contacts and said first, second and third current connection contacts being arranged substantially symmetrically along a line with said first current contact at the center, said second and third current connection contacts on opposite sides of said first current connection, said first sensor connection contact between said first and second current connections and said second sensor connection contact between said first and third current connection contacts;

said sensor connection contacts and said current connection contacts being interrelated so that a current source connected to said first current connection contact and said second and third current connection contacts in the presence of a magnetic field component substantially parallel to the top major surface of said substrate produces a Hall voltage between said first and second sensor connection contacts and a part of said substrate between said top and bottom zones primarily involved in producing the Hall voltage defines a active zone;

said active zone having a conductivity of a second type opposite to the conductivity of the first type;

a first annular zone of a semiconductor material having a conductivity type of the first type surrounding said active zone and extending between said top and bottom zones;

said first annular zone being in electrical contact with said top and bottom and said first and second sensor connection contacts, and said first, second and third current connection contacts being in electrical contact with said active zone;

at least one air shaft at opposite sides of the line of said sensor and current connection contacts;

one air shaft at opposite ends of the line of said sensor and current connection contacts;

each of said air shafts extending from the top major surface of said substrate entirely through said substrate; each of said air shafts having a generally rectangular cross section; and a surface zone of semiconductor material having a conductivity of the first type on the inner surface of each of said air shafts.

8. The electronic device of claim 6, wherein there are surface a plurality of said air shafts at each side of the line of said sensor and current connection contacts and the surface zones in each of said air shafts being in electrical contact with each other.

9. The electronic device of claim 7, wherein there are a plurality of said air shafts at each side of the line of said sensor and current connection contacts and the surface zones of each of said air shafts being in electrical contact with each other.

10. The electronic device of claim 1, further comprising control circuit means coupled between said first sensor connection contact and said electrical connection and operable to control the width of the depletion region formed between said first annular zone and said top layer and bottom layer and between said annular zone with respect to said active zone.

11. The electronic device of claim 10, wherein said control circuit means comprises an actual value generator, a should-be value generator, and a should-be value-/actual value difference generator.

12. The electronic device of claim 11, wherein said actual value generator is an absolute value generator.

13. The electronic device of claim 12, wherein said actual value generator comprises at least one reversing switch, a control device operable for controlling said reversing switch and an inverting amplifier.

14. The electronic device of claim 13, wherein said control device comprises a comparator.

15. The electronic device of claim 12, wherein said actual value generator comprises a diode.

16. The electronic device of claim 11, wherein said should-be generator comprises a series connection of resistors and the source-drain section of a field effect transistor.

17. The electronic device of claim 11, wherein should-be value/actual value difference generator comprises at least of one differential amplifier.

18. The electronic device of claim 17, wherein said differential amplifier is switched as a first inverting amplifier and further comprising a second inverting amplifier connected to said first inverting amplifier in cascade.

19. The electronic device of claim 17, wherein said differential amplifier has first and second actual value input ports, one input port of said first value input ports being connected to an output port of said second value and the other input port of said actual value input being connected to the input port of said actual value generator.

* * * * *